(12) United States Patent
Kelder et al.

(10) Patent No.: US 9,570,734 B2
(45) Date of Patent: Feb. 14, 2017

(54) METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

(71) Applicant: Technische Universiteit Delft, Delft (NL)

(72) Inventors: Erik Maria Kelder, Nootdorp (NL); Jan Rudolf Van Ommen, Zwijndrecht (NL); John Nijenhuis, Asperen (NL)

(73) Assignee: Technische Universiteit Delft, Delft (NL)

( * ) Notice: Subject to any disclaimer, the term of this patent is extended or adjusted under 35 U.S.C. 154(b) by 0 days.

(21) Appl. No.: 15/077,134

(22) Filed: Mar. 22, 2016

(65) Prior Publication Data
US 2016/0226057 A1    Aug. 4, 2016

Related U.S. Application Data

(60) Continuation of application No. 14/625,442, filed on Feb. 18, 2015, which is a division of application No.
(Continued)

(51) Int. Cl.
| | |
|---|---|
| H01M 4/04 | (2006.01) |
| B01J 2/16 | (2006.01) |
| C23C 16/44 | (2006.01) |
| C23C 16/442 | (2006.01) |
| C23C 16/455 | (2006.01) |
| H01M 4/36 | (2006.01) |
| H01M 4/505 | (2010.01) |

(Continued)

(52) U.S. Cl.
CPC .............. *H01M 4/0428* (2013.01); *B01J 2/16* (2013.01); *C23C 16/442* (2013.01); *C23C 16/4417* (2013.01); *C23C 16/45525* (2013.01); *H01M 4/131* (2013.01); *H01M 4/1391* (2013.01); *H01M 4/366* (2013.01); *H01M 4/485* (2013.01); *H01M 4/505* (2013.01); *H01M 10/0525* (2013.01); *H01M 2004/028* (2013.01); *Y02E 60/122* (2013.01); *Y10T 428/2991* (2015.01)

(58) Field of Classification Search
None
See application file for complete search history.

(56) References Cited

U.S. PATENT DOCUMENTS 6,365,299 B1 * 4/2002 Miyaki ................. H01M 4/131
  429/131
6,713,177 B2   3/2004 George et al.
(Continued)

OTHER PUBLICATIONS

Ohta et al. Adv. Mater. 2006, 18, 2226-2229 (Aug. 2006).*
(Continued)

*Primary Examiner* — Miriam Stagg
*Assistant Examiner* — Wojciech Haske
(74) *Attorney, Agent, or Firm* — Foley & Lardner LLP; Sunit Talapatra

(57) ABSTRACT

A method for covering particles having a diameter of maximally 60 μm by means of atomic layer deposition, whereby said method comprises the step of fluidizing said particles in a fluidized bed reactor using a first reactant gas comprising a first reactant for substantially completely covering said particles with a monolayer of said first reactant.

17 Claims, 7 Drawing Sheets

Related U.S. Application Data

11/955,184, filed on Dec. 12, 2007, now Pat. No. 8,993,051.

(51) Int. Cl.

| | | |
|---|---|---|
| *H01M 4/131* | (2010.01) | |
| *H01M 4/485* | (2010.01) | |
| *H01M 4/1391* | (2010.01) | |
| *H01M 10/0525* | (2010.01) | |
| *H01M 4/02* | (2006.01) | |

(56) References Cited

U.S. PATENT DOCUMENTS

| | | | |
|---|---|---|---|
| 6,913,827 B2 | 7/2005 | George et al. | |
| 2001/0034123 A1 | 10/2001 | Jeon et al. | |
| 2002/0071991 A1* | 6/2002 | Kweon ............... | H01M 4/131 |
| | | | 429/231.1 |
| 2002/0106461 A1 | 8/2002 | Talton | |
| 2002/0110518 A1* | 8/2002 | Okuda ............... | C01G 51/42 |
| | | | 423/594.4 |
| 2002/0192551 A1 | 12/2002 | Yoshizawa et al. | |
| 2004/0087143 A1 | 5/2004 | Norman et al. | |
| 2004/0159830 A1 | 8/2004 | Weimer et al. | |

OTHER PUBLICATIONS

Ferguson et al. Applied Surface Science 226 (2004) 393-404.*
McCormick et al. J. Vac. Sci. Technol. A 25(1), Jan./Feb. (2007) 67-74.*
Beetstra, Improved Li-Ion Battery Performance, The 12th International Conference on Fluidization—New Horizons in Fluidization Engineering, vol. RP4, Article 44, Jul. 2007.
Kannan, Electrochemical and Solid-State Letters, 5(7)A167-A 169 (2002).
Lafont, U., "Nanopowders of Spinel-Type Electrode Materials for Li-ion Batteries", Solid State Ionics, 177, 2006, pp. 3023-3029.
Wayback Machine (Internet) archive—showing Beetstra, 12th International Conference paper available on internet Jul. 2007.
Snyder, Mark Q., et al, "Preparation and Characterization of ALDN TiN Thin Films on Lithium Titanate Spinel(Li4Ti5012)for Lithium-Ion Battery Applications." Paper presented at Fall MRS Meeting, Boston, MA (Nov. 29, 2006, 9:45 AM).
Wank, Jeffrey R., et al., "Coating fine iron particles with an oxidation-resistant -alumina nanolayer using ALD in a fluidized bed reactor." In Fluidization XI Proceedings of the 11th International Conference on Fluidization Engineering, U. Arena, et al., eds. (Brooklyn, NY: Engineering Conferences International), pp. 603-610(May 1, 2004) (Distributed first day of conference, and earlier to some pre-registrants.).
Engineering Conferences International (ECI),Program,"Fluidization XI, Present and Future for Fluidization Engineering." (May 9-14, 2004). http://www.engconf.org/pastconf/4affin.Pdf.
Myung, Seung-Tack, et al., "Role of Alumina Coating on Li—Ni—Co-Mn—0 Particles as Positive Electrode Material for Lithium-Ion Batteries," Chem. Mater. 17: 3695-3704 (2005).
Snyder, Mark Q., et al., "Preparation and Characterization of ALDN TiN Thin Films,"Mater. Res. Soc. Symp. Proc., vol. 972 (2007), Materials Research Society 0972-AA07-05-BB08-05(based on the public presentation of reference R2A), In Solid-State Ionics, pp. 331-338 (2006),Issue 2007.(http://www.mrs.or/fall 2006).
Y.-K. Sun, et al., "Significant improvement of high voltage cycling behavior AlF3-coated LiCoO2 cathode", Electrochemistry Communications, 8:821-826 (2006).
Wank, Jeffrey R., et al., "Coating fine iron particles with an oxidation-resistant v-alumina nanolayer using ALD in a fluidized bed reactor." Paper presented at the Conference of "Fluidization XI, Present and Future for Fluidization Engineering." Naples, Italy (May 12, 2004,12:40PM).

* cited by examiner

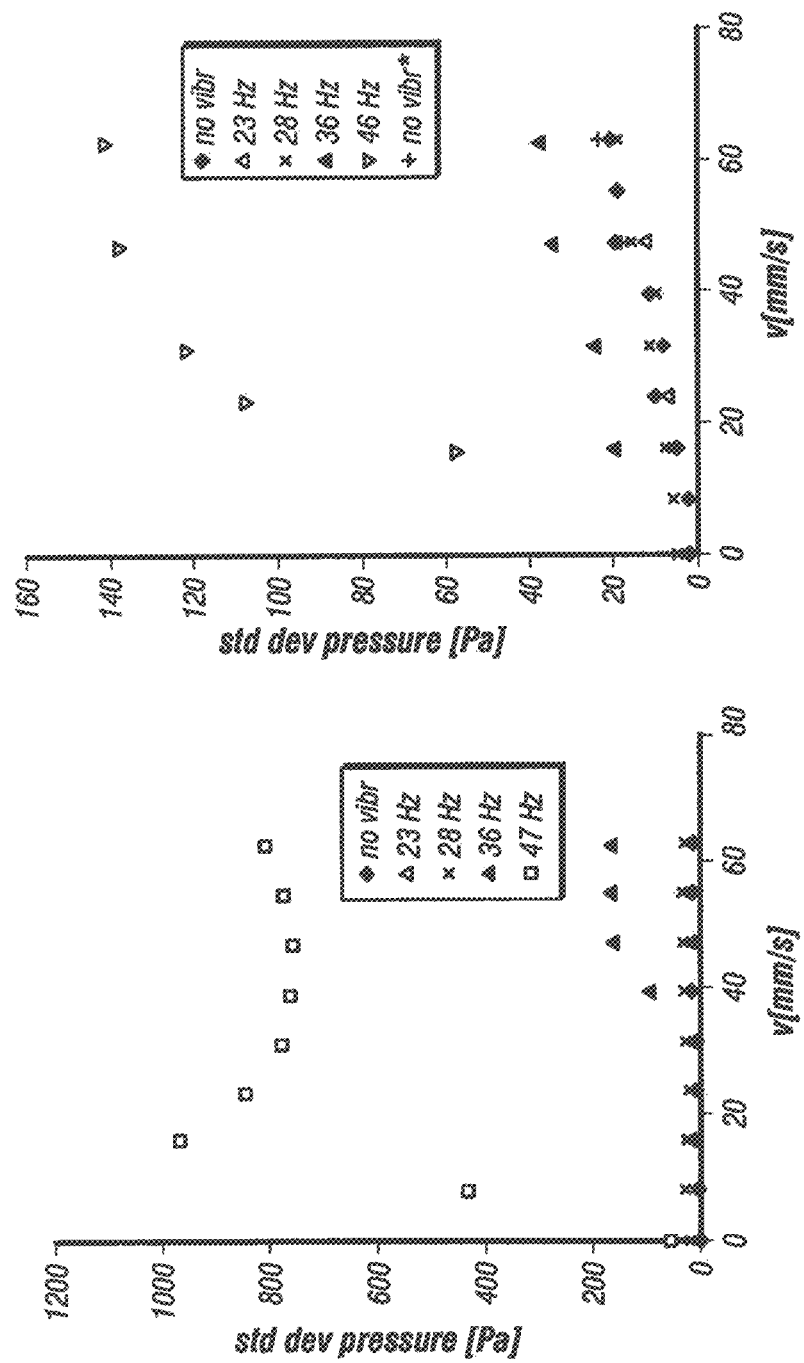

METHOD FOR COVERING PARTICLES, ESPECIALLY A BATTERY ELECTRODE MATERIAL PARTICLES, AND PARTICLES OBTAINED WITH SUCH METHOD AND A BATTERY COMPRISING SUCH PARTICLE

CROSS-REFERENCE TO RELATED PATENT APPLICATIONS

This application is a Continuation of U.S. patent application Ser. No. 14/625,442, filed Feb. 18, 2015, which is a Divisional of U.S. patent application Ser. No. 11/955,184, now U.S. Pat. No. 8,993,051. These applications are incorporated herein by reference in their entirety.

BACKGROUND OF THE INVENTION

Field of the Invention (Technical Field)

The present invention relates to a method for covering particles having a diameter of maximally 60 μm by means of atomic layer deposition. The present invention also relates to particles obtainable by such method, and a battery containing said particles.

Description of Related Art

Such a method is known from the art. Although hereinafter mainly reference will be made to particles to be used in a battery, for example and preferably lithium containing particles, such as $LiMn_2O_4$, $LiCoO_2$ or $LiNiO_2$ as well as other lithium containing materials, such as $LiFePO_4$ and others, the method can be used for subjecting all kinds of particles in the said size range by means of atomic layer deposition.

In the art, the use of lithium ion batteries has many advantages over other cathode material containing batteries, especially with respect to rechargeable batteries. Compared to nickel-cadmium batteries and nickel-metal-hydride batteries, the output voltage of lithium ion batteries is higher. Secondly, the energy density is higher, resulting in smaller and lighter batteries. Other advantages of lithium ion batteries are a low self-discharge, good cycle-life and very low maintenance. Drawbacks of lithium ion materials are the relatively high costs and long charging times, and the fact that the batteries age in time, whether they are being used or not.

During the discharge of the lithium ion batteries, lithium ions are transferred from the negative electrode side of the battery to the positive electrode side. Recent research activities have provided new electrode materials, that provide an improved transport of lithium ions. An example of this material is $Li_4Ti_5O_{12}$, which is used as a negative electrode material having the spinel structure. This material has a three-dimensional structure for lithium intercalation (the insertion of lithium into the crystal lattice). With this material, high charge and discharge rates are possible. A drawback of this material is that the potential at which lithium intercalation occurs is much higher than that for negative electrode materials used thus far. As a result, the battery will have a lower output voltage than was usual for lithium ion batteries. To compensate for this problem, new positive electrode materials have been developed with higher potentials than the currently used materials. Potential (Possible) new positive electrode materials are based on $LiMn_2O_4$ (comprising a 50/50 combination of $Mn^{3+}$ and $Mn^{4+}$), with possible additives like Mg, Ni, like $LiMg_xNi_{0.5-x}Mn_{1.5}O_4$, (comprising only $Mn^{4+}$) which is also of the spinel-type. The positive electrode voltage is 4.7-4.9 V, against $Li/Li^+$. Therefore, the battery output voltage for a combination consisting of $Li_4Ti_5O_{12}/LiMg_xNi_{0.5-x}Mn_{1.5}O_4$ (comprising $Mn^{4+}$, and a combination of $Ni^{2+}$ and $Ni^{4+}$) can be 3.2-3.4 V, which still is a very acceptable value.

Hereafter in this description the negative electrode will be referred to (identified) as the anode and the positive electrode will be referred to (identified) as the cathode.

A problem with the above identified cathode material is the dissolution of transition metal ions, especially Mn-ions, in the electrolyte. When this occurs, the structure of the material changes and there is a smaller number of positions available for lithium intercalation. In addition, the high oxidation ability of $Mn^{4+}$-ions may lead to a decomposition of the solvents in the electrolyte. These factors lead to a capacity loss that is independent of the cycling but proceeds progressively in time. The capacity fading increases with temperature: when Li-ion batteries are stored at temperatures of 60° C., a battery may lose up to 40% of its capacity in only three months time. The problem is more severe for high-voltage materials (e.g. Mn and Fe comprising materials) than for "regular" cathode materials. A specific example of a Fe-containing cathode material, is $LiFe_xTi_yMn_{2-x-y}O_4$ wherein $0<y<0.3$.

Recently, also research has been performed dedicated to the use of nano-powders in batteries. These powders have several advantages over the current cathode or anode materials. Firstly, the surface area per weight increases strongly, leading to enhanced charge transfer (faster charging). Secondly, the diffusion lengths for Li-ions are very short, which enhances the power performance by increasing the effective capacity for lithium storage. Thirdly, the nano-powders are much more resistant to stresses due to expansion and shrinking during intercalation and de-intercalation of the lithium ions, which cause crystal fatigue and loss of capacity in regular cathode materials.

An important drawback of nano-materials in batteries is the increased dissolution of the transition metal ions. This dissolution in the electrolyte is a surface related problem, and therefore increases very fast with decreasing particle size.

BRIEF SUMMARY OF THE INVENTION

Therefore, the invention aims at providing a method for protecting the nano-particles from dissolution in the electrolyte.

The invention also aims at providing a method for providing a coating on nano-particles, without influencing the electrochemical properties of the particles.

The invention especially aims at providing a coating on lithium containing particles of less than 60 μm.

DETAILED DESCRIPTION OF THE INVENTION

According to the invention, the method for covering said particles comprises the steps as mentioned in claim 1. By means of this method, a very uniform and as thin as possible layer is obtained on said nano-particles. According to a preferred embodiment, the method further comprises the step of (b) subsequently fluidizing said particles in said fluidized bed reactor using a second reactant gas comprising a second reactant for substantially completely covering said particles obtained in step (a) with a monolayer of said second reactant. Such a method is especially preferred if a layer should be provided on the nano-particles that is a product of two different reactants, that are provided subsequently to the nano-particles. Such is especially very suitable if the first reactant adsorbs on and/or optionally reacts with the nano-particles, and wherein the second reactant adsorbs on and/or reacts with the first layer that is provided on the nano-particles. A preferred embodiment comprises the step adding as said first reactant a component chosen from any of: a hydroxide providing component, an oxide providing reactant, an alkyl metal providing component, a metal alkanolate providing component, or the like, and adding as said second reactant a reactant that is different from said first reactant and is chosen from any of: a hydroxide providing component, an oxide providing reactant, an alkyl metal providing component, a metal alkanolate providing component, or the like. As a matter of fact, if the nano-particles already comprise an oxide layer or a hydroxide layer, the first step of the method according to the invention may comprise adding a reactant that provides a metal on said nano-particles, preferably an alkyl metal compound or a metal alkanolate compound, such that a monolayer of the reaction product of this metal with the hydroxide or oxide may be obtained. If required, a further suitable reactant may subsequently be added, so as to obtain a dry alumina monolayer on said material (or any respective metal oxide layer, for example a zincoxide monolayer).

Any combination of reactants may be added subsequently during fluidization of the nano-particles, so as to add a first reactant that adsorbs to and/or reacts with the surface layer of the nano-particles, wherein the second reactant adsorbs to and/or reacts with the firstly added reactant, and one or more further reactants are added in subsequent steps for further adsorption to and/or reaction with said secondly added reactant.

All steps wherein different reactants are added, are performed subsequently. The addition of the first reactant in a carrier gas or as a pure reactant, may be followed by the addition of a second reactant, optionally in a carrier gas or as a pure reactant, and may be performed without interruption, and optionally with the intermittent addition of a gas that is non-reactive (i.e., inert) to the nano-particles and/or the reactant added previously.

A suitable method may consist of adding a fluidization gas to the particles in a fluidized bed and injecting, or otherwise adding, said reactant to the fluidization gas. This is a convenient way to keep the fluidization gas substantially constant and wherein the amount of reactant can be adjusted precisely.

It is preferred that the method is performed on particles having a diameter of maximally 60 μm. Preferably, the particles have a diameter in the range within 10 nm and 500 nm. More preferably, the diameter of the particles is at least 10 nm at maximally 100 nm.

It has shown that a battery containing electrode particles that are protected by means of a nano-layer that is obtained by a method according to the present invention, has an increased lifetime. Although a fluidization technique has already been used for atomic layer deposition on small particles, this method has hitherto not been used for nano-particles. Fluidization techniques for such particles are only known for systems where the pressure in the fluidization reactor is reduced. According to the present invention, it has shown that it is possible to use increased pressures in the fluidization reactor, of about atmospheric pressure or above. As a rule, this pressure is measured at a position above the fluidized bed.

It was regarded impossible to perform an atomic layer deposition technique on nano-particles since, due to the very high contact surface the heat production would become too high. However, with the present invention this has shown to be no problem at all. On the contrary, the temperature in the fluidized bed is very homogeneous, probably due to the intense mixing of the particles in the fluidized bed. As a consequence, the covering of the nano-particles with the reactant (reactants) is very homogeneous, such that nano-particles are obtained with a very homogeneous nano-layer thereon, and as a result of which, the batteries have a very constant quality.

The method according to the state of the art for covering nano-particles consisted of using a chemical vapor deposition technique on nano-particles, however, without intense stirring of the nano-particles. As a consequence, the layer covering the nano-particles was very inhomogeneous and hence, the quality of the batteries obtained therewith also fluctuated greatly.

According to the state of the art, the dimensions of the nano-particles were increased, with a consequence that diffusion length of the lithium ions increases, and the charging and discharging time also increased.

The Invention

The invention will now be further elucidated by means of an example. This example is only intended to provide an explanation of the invention, and should not be regarded as a limitation to the scope of protection.

In the fluidized bed reactor, a vibrator is used. Due to this vibrator, an increased fluidization of the nano-particles is obtained. However, this vibrator is not an obligation.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

1. Valve V1 is opened, so that part of the nitrogen is led through a bubbler containing the organo-metallic precursor and saturated with its vapor. This vapor adsorbs on the particle surface;
2. When the complete particle surface is covered with the precursor, V1 is closed and V2 is opened to flush the tubes with pure nitrogen. This prevents (undesired) reactions in the tubes;
3. V2 is closed and V3 opened to lead the gas through a bubbler containing water. The water vapor reacts with the organo-metal on the surface of the powder;
4. V2 is opened again and V3 closed to clear the tubes for the next cycle.

These steps are repeated until a sufficient number of cycles have been performed to achieve the desired thickness of the coating.

The variables that can be adapted in the ALD-process are the number of cycles, coating material, overall flow, reactant concentration, cycle times for precursor and water, vibration frequency, reaction temperature, etc. During the process the temperature, pressure difference and pressure fluctuations are recorded.

For the experiments described in this paper, only the fluidization part of the set-up has been used, i.e., gas without reactants for the fluidization, assisted by vibration. The gas flow was varied from 0 to 21/min. (velocities of 0-63 mm/s), and several vibration frequencies were used, ranging from 0-47 Hz. Higher gas velocities were not used because the particles started to be elutriated from the column.

Pressure fluctuations were measured at a frequency 20 of 400 Hz using piezo-electric pressure transducers, Kistler type 7261, at two heights in the column: 50 mm and 125 mm above the gas distributor. For titania particles, that were used in some experiments, the data from 125 mm are given here because of a blockage of the lower measuring point after some time; for the cathode particles the height of 50 mm was used due to the lower initial bed height. For the titania particles, the data from the higher and lower measuring point were comparable. The fluidization experiments were done at room temperature and atmospheric pressure.

Figure 1:
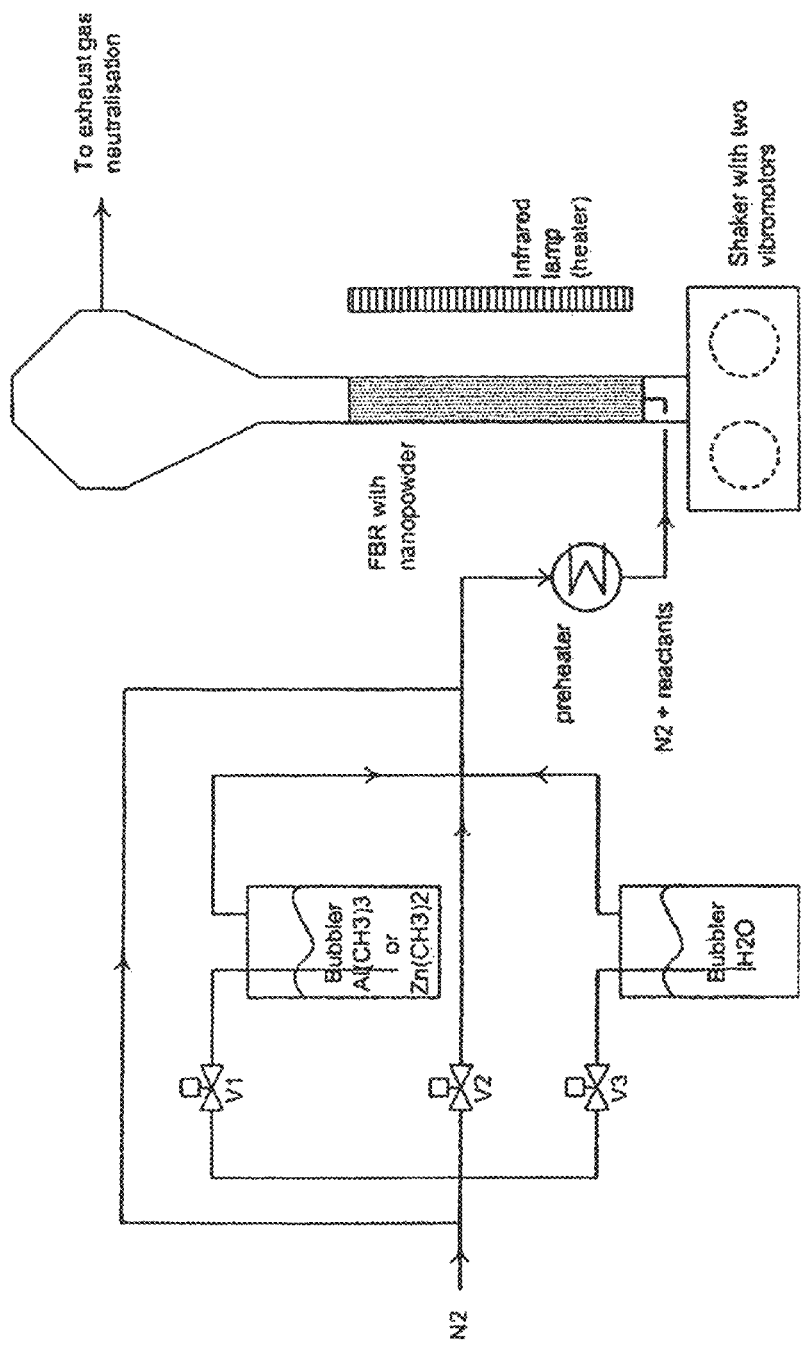
FIG. 1 shows a schematic drawing of the experimental setup for the ALD-process (atomic layer deposition). It consists of a 26 mm internal diameter, 500 mm long glass reactor tube that is filled with $LiMg_{0.05}Ni_{0.45}Mn_{1.5}O_4$ nano-particles with a diameter of 10-50 nm. The reactor is placed on a shaker driven by two vibromotors that produce a low amplitude vibration at adjustable frequency to assist fluidization. The fluidizing gas is nitrogen. Each ALD-cycle consists of four process steps.
Figure 2:
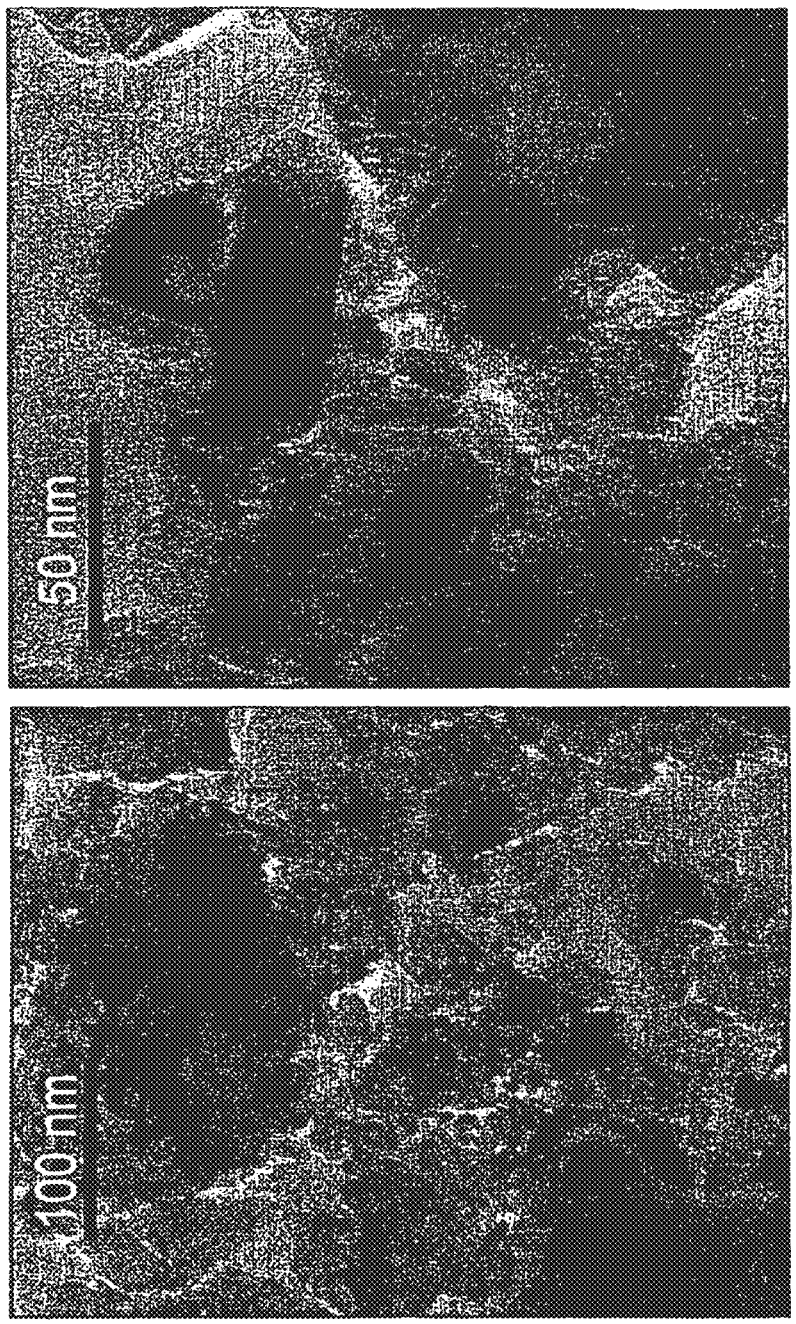

Two types of particles were used: the first type is the $LiMg_{0.05}Ni_{0.45}Mn_{1.5}O_4$ cathode material, which was prepared by an auto-ignition method (described by Lafont et al.). FIG. 2 shows TEM (transmission electron microscope) pictures of this material. The particle dimensions observed in these TEM images are 20-100 nm. A (Brunauer-Emmett-Teller) BET-analysis rendered a surface of 6.4 $m^2$/g, from which an equivalent diameter of 213 nm can be calculated. Laser diffraction showed a very wide particle size distribution, ranging from 40 nm or smaller (40 nm is the lower limit of the apparatus) to 60 μm (clusters). Combination of these measurements leads to the conclusion that the particles form clusters, and that part of the clusters are "hard" aggregates, with some necking between the primary particles. To make a comparison possible, also a more common type of nanoparticles has been investigated: commercial titania particles. These particles have a diameter of 20-25 nm and a surface area of 90 $m^2$/g (data from manufacturer Kerr-McGee Pigments). It is expected that it is a loose powder and at all aggregates in this powder are soft aggregates that break up easily.

Figure 3:
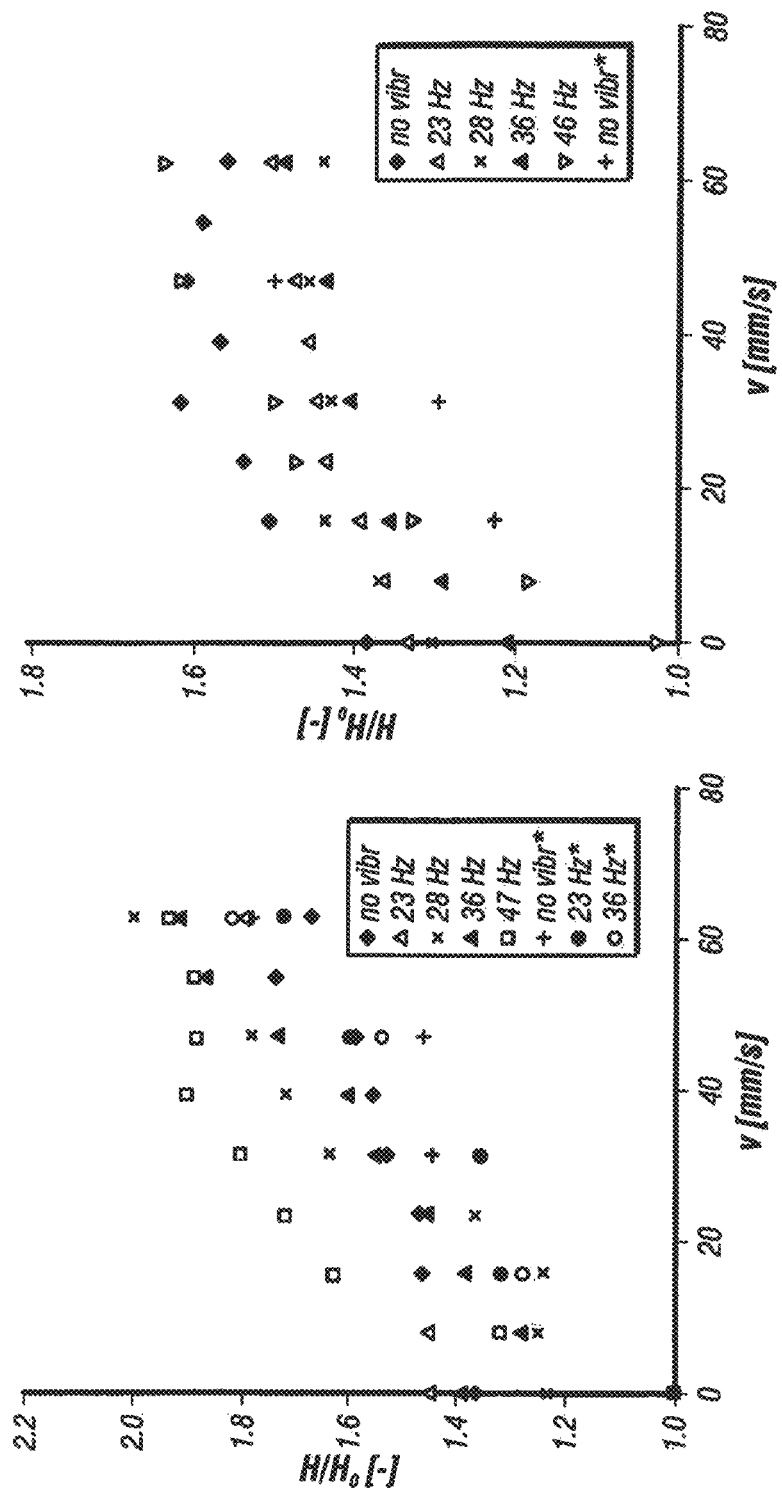

FIG. 3 shows the relative bed expansion during the experiments. To calculate this, the minimum bed height as measured during all experiments, was taken as the initial bed height $H_0$. This minimum was found when the bed was compacted at the highest vibration frequency. For these experiments, the vibration frequency was set to a fixed value, and the gas velocity adjusted. We started with the lowest frequency.

However, the experiments were also carried out with particles with a history of vibration, also at high frequencies; these particles are marked with an * in the figures. The graphs confirm that the initial bed height depends on the vibration frequency, at higher frequencies the particles are packed closer.

Visual observations of the fluidization behavior of the cathode particles suggest that at low gas velocities, there is some channeling. At higher velocities, the eruptions at the bed surface are more violent and appear to originate from (small) bubbles, although these are hard to distinguish since the powder is black. The vibrations have some influence: at high frequencies bubbles start to appear at lower gas velocities. The effect was not quantified due to aforementioned visibility problems. For the (white) titania powder it is easier to distinguish channels and bubbles. For each velocity and frequency, there is a certain part in the bottom of the bed that is not moving. Some large aggregates can be distinguished here and channeling occurs in between these aggregates. The height of this part decreases with gas velocity and vibration frequency. Above this bottom zone, the bed fluidizes with small bubbles. A memory effect could be noticed for both particle types, although it was stronger and lasted longer for the titania. The non-moving bottom zone was much smaller for particles with a history of vibration than for "fresh" particles. An explanation could be that part of the aggregates was broken up by the high frequencies, and only the very large (hard) aggregates remained. The bed expansion factor H/H0 reached a maximum value of 2.0 for the cathode particles and 1.63 for the titania particles. It was also found that when the vibration and gas flow are stopped, the bed does not return to its initial height, and even after several days it may still be expanded (H/H01, 4), showing that the aggregates are very loosely packed. The measured porosities for the cathode particles were in the range of 0.66-0.83, and for the titania it was 0.87-0.92.

Figure 4B:
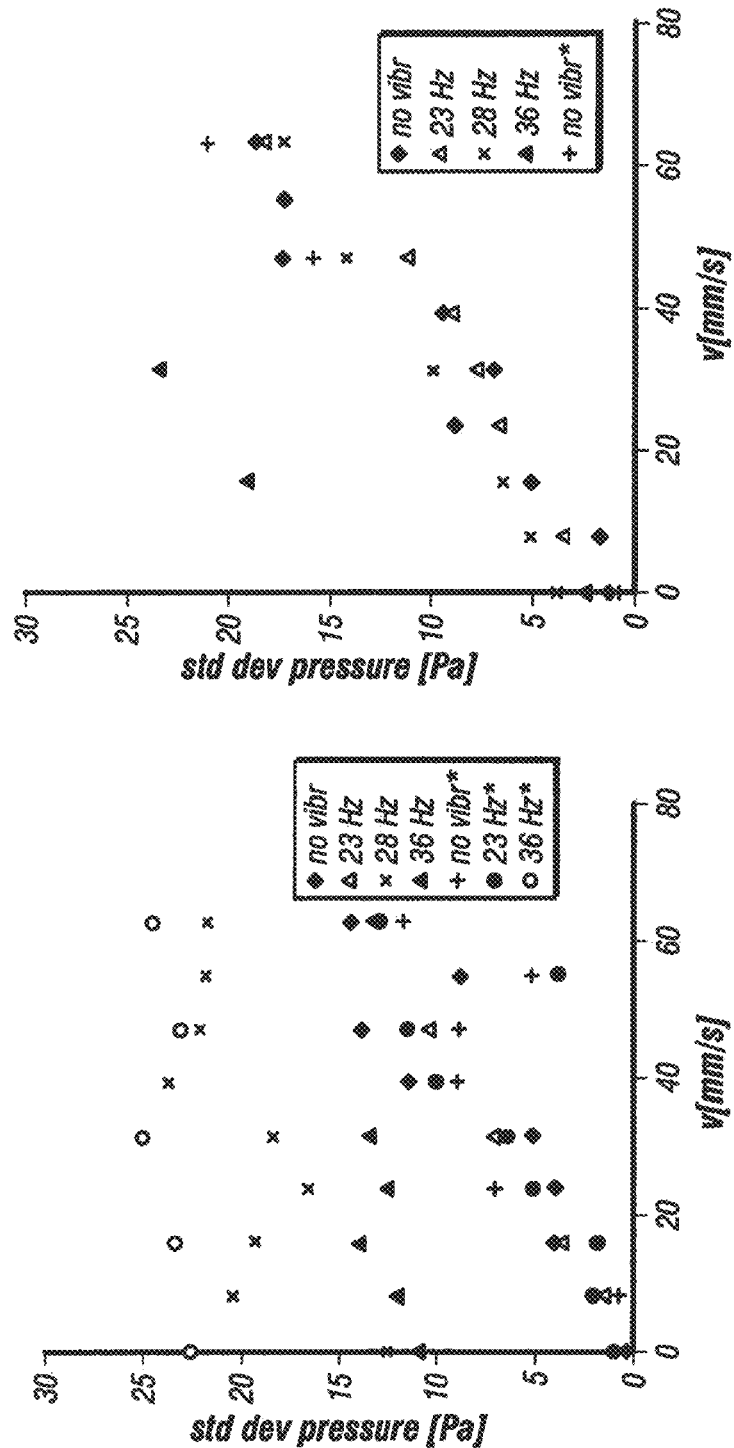

FIGS. 4A and 4B show the standard deviation of the pressure signal during the experiments, which could provide information on the regime in which the fluidized bed is operating. The pressure fluctuations in the experiments with a high vibration frequency are determined mainly by the vibrations, the influence of the gas flow was minor. This was confirmed by the power spectrum, where high peaks occurred at the vibration frequency. When there is no vibration or vibration at a low frequency, there is a noticeable influence of the gas flow on the pressure fluctuations, as is observed in a regular gas-fluidized bed as well.

For the cathode particles, the sudden rise followed by a decrease in the fluctuations at high frequencies could indicate a transition from bubbling to turbulent regime. However, more data are necessary to confirm this and explain the mechanism. For the $TiO_2$ this transition was not observed for the studied range of gas velocities. The data series from particles with a vibration history show that this history and the change in fluidization behavior it causes do not have a large influence on the pressure fluctuations.

Figure 5:
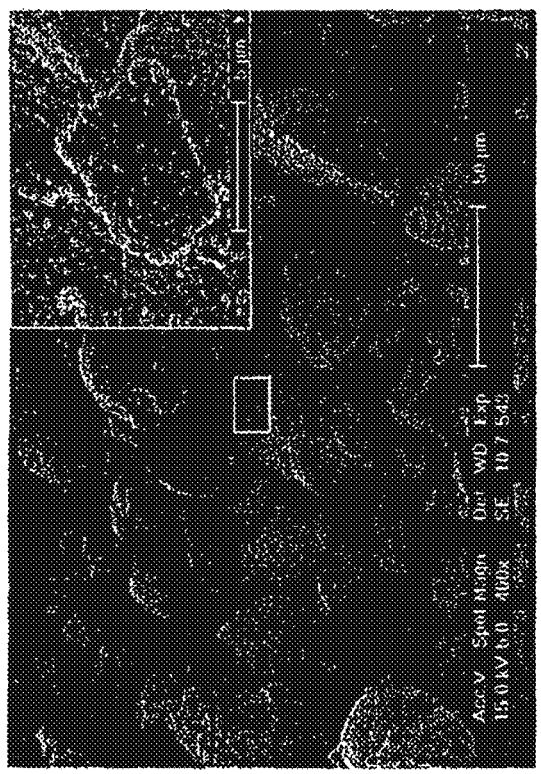

FIG. 5 further shows SEM (scanning electron microscope) photographs of particles obtained according to the method of the present invention and wherein as a first reactant water was added for forming a hydroxide monolayer on the particles ($LiMn_2O_4$). Then, trimethylaluminium (TMA) was added to the fluidization gas so as to perform a reaction of said TMA with the hydroxide monolayer. Subsequently, a further addition of water was performed, and a first monolayer of alumina on said particles was obtained. This combination of steps was repeated until an alumina layer on said particles was obtained in a sufficient thickness and was very homogeneous. The layer turned out to have a thickness of about 2 nm and consisted (by means of EDX (energy dispersive x-ray) in a SEM) of aluminium oxide.

Figure 6:
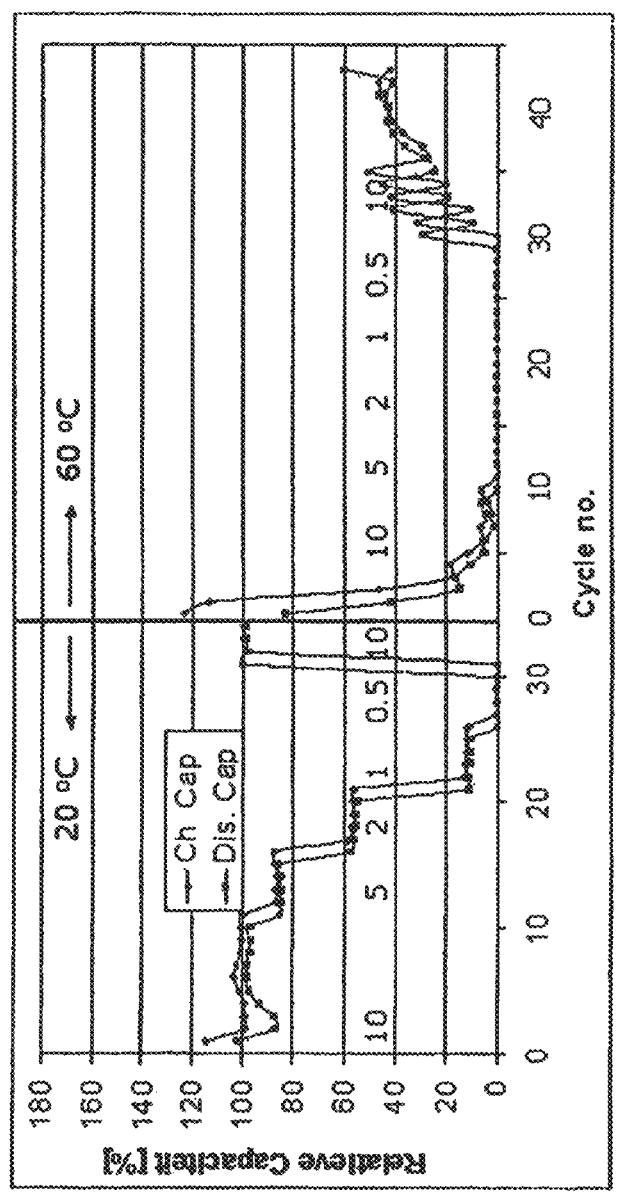

The FIG. 6 shows the results on cyclic behavior of repeatedly charging and discharging batteries made from the coated particles according to the invention and uncoated particles as a reference example. Both at low temperature (20° C.) and high temperature (60° C.) the capacity at fast and slow discharge and charge rate is much higher in the batteries containing the coated particles as cathode material. Also, the uncoated particles show a clear fading in capacity due to degradation of the cathode material.

Therefore, from the above example, it can be concluded that the method, according to the present invention, is a suitable way for providing a protective layer on nanoparticles.

The invention claimed is:

1. An electrode comprising a plurality of particles having a diameter of maximally 60 μm, wherein the particles are coated with a protective layer having a uniform thickness of about 2 nm or less, wherein the protective layer of the particles is obtained by atomic layer deposition, wherein the particles are lithium containing particles.

2. The electrode of claim 1, wherein the electrode is a cathode.

3. The electrode of claim 1, wherein the particles comprise a lithium metal oxide or a lithium metal phosphate.

4. The electrode of claim 1, wherein the particles comprise one or more of $LiMn_2O_4$, $LiCoO_2$, $LiNiO_2$, $LiFePO_4$, $Li_4Ti_5O_{12}$, $LiMg_xNi_{0.5-x}Mn_{1.5}O_4$, and $LiFe_xTi_yMn_{2-x-y}O_4$.

5. The electrode of claim 1, wherein the particles have a diameter of 10 nm to 60 μm.

6. The electrode of claim 1, wherein the particles have a diameter of 10 nm to 500 nm.

7. The electrode of claim 1, wherein the particles have a diameter of 10 nm to 100 nm.

8. The electrode of claim 1, wherein the particles are coated with a metal oxide layer of about 2 nm or less.

9. The electrode of claim 1, wherein the particles are coated with an alumina layer of about 2 nm or less.

10. The electrode of claim 1, wherein the particles are protected from dissolution of transition metal ions in an electrolyte, resulting in a capacity reduction less than 40% when stored at 60° C. in a charged state over a three-month time period.

11. The electrode of claim 1, wherein the particles comprise one or more of primary particles and hard aggregates of primary particles.

12. The electrode of claim 1, wherein the particles are obtained using an auto-ignition synthesis method.

13. The electrode of claim 1, wherein the protective layers on the particles are obtained by
 (a) fluidizing the particles in a fluidized bed reactor using a first reactant gas comprising a first reactant for substantially covering said particles with a monolayer of said first reactant;
 (b) subsequently fluidizing said particles obtained in step (a) in said fluidized bed reactor using a second reactant gas comprising a second reactant for substantially covering the monolayer on said particles obtained in step (a); and
 (c) repeating step (a) and step (b) sequentially to obtain the protective layer having a thickness of about 2 nm or less.

14. A battery comprising the electrode of claim 1.

15. A powder adapted for use in an electrode, comprising a plurality of particles having a diameter of maximally 60 μm, wherein the particles are coated with a protective layer having a uniform thickness of about 2 nm or less, wherein the protective layer of the particles is obtained by atomic layer deposition, wherein the particles are lithium containing particles.

16. The powder of claim 15, wherein the particles are lithium containing particles having a diameter of 10 nm to 500 nm and coated with a metal oxide layer of 2 nm or less.

17. The powder of claim 15, wherein the particles are lithium containing particles having a diameter of 10 nm to 100 nm and coated with an alumina layer of 2 nm or less.

* * * * *